(12) United States Patent
Yamaguchi et al.

(10) Patent No.: US 7,923,778 B2
(45) Date of Patent: Apr. 12, 2011

(54) THIN FILM INTEGRATED CIRCUIT AND METHOD FOR MANUFACTURING THE SAME, CPU, MEMORY, ELECTRONIC CARD AND ELECTRONIC DEVICE

(75) Inventors: Tetsuji Yamaguchi, Aichi (JP); Atsuo Isobe, Kanagawa (JP); Satoru Saito, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 80 days.

(21) Appl. No.: 11/876,429

(22) Filed: Oct. 22, 2007

(65) Prior Publication Data
US 2008/0179599 A1 Jul. 31, 2008

Related U.S. Application Data

(62) Division of application No. 11/110,918, filed on Apr. 21, 2005, now Pat. No. 7,288,480.

(30) Foreign Application Priority Data

Apr. 23, 2004 (JP) ................................ 2004-128735

(51) Int. Cl.
*H02L 27/14* (2006.01)
*H01L 27/88* (2006.01)
(52) U.S. Cl. ........................................ 257/341; 257/384
(58) Field of Classification Search .................. 257/347, 257/384, E21.413, 27.11, 29.147, 151.728, 257/293, 295
See application file for complete search history.

(56) References Cited

U.S. PATENT DOCUMENTS
5,403,772 A 4/1995 Zhang et al.
(Continued)

FOREIGN PATENT DOCUMENTS
CN 1395299 2/2003
(Continued)

OTHER PUBLICATIONS

Maeguchi et al., "5. $TiSi_2$ $CoSi_2$, NiSi", Innovation In Logic LSI Technology, Science Forum, Aug. 10, 1995, pp. 238-241.
(Continued)

*Primary Examiner* — Long Pham
*Assistant Examiner* — Steven H Rao
(74) *Attorney, Agent, or Firm* — Nixon Peabody LLP; Jeffrey L. Costellia

(57) ABSTRACT

A salicide process is conducted to a thin film integrated circuit without worrying about damages to a glass substrate, and thus, high-speed operation of a circuit can be achieved. A base metal film, an oxide and a base insulating film are formed over a glass substrate. A TFT having a sidewall is formed over the base insulating film, and a metal film is formed to cover the TFT. Annealing is conducted by RTA or the like at such a temperature that does not cause shrinkage of the substrate, and a high-resistant metal silicide layer is formed in source and drain regions. After removing an unreacted metal film, laser irradiation is conducted for the second annealing; therefore a silicide reaction proceeds and the high-resistant metal silicide layer becomes a low-resistant metal silicide layer. In the second annealing, a base metal film absorbs and accumulates heat of the laser irradiation, and a semiconductor layer is supplied with beat of the base metal film in addition to heat of the laser irradiation, thereby enhancing efficiency of the silicide reaction in the source and drain regions.

6 Claims, 11 Drawing Sheets

U.S. PATENT DOCUMENTS

| | | | |
|---|---|---|---|
| 5,426,064 A | 6/1995 | Zhang et al. | |
| 5,576,556 A | 11/1996 | Takemura et al. | |
| 5,595,944 A | 1/1997 | Zhang et al. | |
| 5,639,698 A | 6/1997 | Yamazaki et al. | |
| 5,644,147 A | 7/1997 | Yamazaki et al. | |
| 5,648,277 A | 7/1997 | Zhang et al. | |
| 5,757,456 A | 5/1998 | Yamazaki et al. | |
| 5,807,770 A | 9/1998 | Mineji | |
| 5,814,540 A | 9/1998 | Takemura et al. | |
| 5,818,070 A | 10/1998 | Yamazaki et al. | |
| 5,834,327 A | 11/1998 | Yamazaki et al. | |
| 5,897,347 A | 4/1999 | Yamazaki et al. | |
| 5,923,968 A | 7/1999 | Yamazaki et al. | |
| 5,956,579 A | 9/1999 | Yamazaki et al. | |
| 5,962,897 A * | 10/1999 | Takemura et al. | 257/347 |
| 5,986,286 A | 11/1999 | Yamazaki et al. | |
| 6,074,900 A | 6/2000 | Yamazaki et al. | |
| 6,118,502 A | 9/2000 | Yamazaki et al. | |
| 6,218,678 B1 | 4/2001 | Zhang et al. | |
| 6,355,512 B1 | 3/2002 | Yamazaki et al. | |
| 6,369,410 B1 | 4/2002 | Yamazaki et al. | |
| 6,455,875 B2 | 9/2002 | Takemura et al. | |
| 6,475,839 B2 | 11/2002 | Zhang et al. | |
| 6,512,246 B1 * | 1/2003 | Tanabe | 257/72 |
| 6,596,571 B2 | 7/2003 | Arao et al. | |
| 6,605,496 B1 | 8/2003 | Yamazaki | |
| 6,613,614 B2 | 9/2003 | Yamazaki et al. | |
| 6,617,612 B2 | 9/2003 | Zhang et al. | |
| 6,624,477 B1 | 9/2003 | Takemura et al. | |
| 6,670,640 B1 | 12/2003 | Yamazaki et al. | |
| 6,773,996 B2 | 8/2004 | Suzawa et al. | |
| 6,790,749 B2 | 9/2004 | Takemura et al. | |
| 6,800,553 B2 | 10/2004 | Jung et al. | |
| 6,809,339 B2 | 10/2004 | Suzawa et al. | |
| 7,050,138 B1 | 5/2006 | Yamazaki et al. | |
| 7,122,445 B2 | 10/2006 | Takayama et al. | |
| 2002/0006705 A1 | 1/2002 | Suzawa et al. | |
| 2002/0011627 A1 | 1/2002 | Takemura et al. | |
| 2002/0016028 A1 | 2/2002 | Arao et al. | |
| 2003/0006414 A1 | 1/2003 | Takemura et al. | |
| 2003/0032210 A1 | 2/2003 | Takayama et al. | |
| 2004/0018670 A1 | 1/2004 | Arao et al. | |
| 2004/0135216 A1 | 7/2004 | Suzawa et al. | |
| 2004/0263712 A1 | 12/2004 | Yamazaki et al. | |
| 2005/0037549 A1 | 2/2005 | Takemura et al. | |
| 2005/0040403 A1 | 2/2005 | Suzawa et al. | |
| 2005/0052584 A1 | 3/2005 | Yamazaki et al. | |
| 2005/0070038 A1 | 3/2005 | Yamazaki et al. | |

FOREIGN PATENT DOCUMENTS

| | | |
|---|---|---|
| CN | 1472772 A | 2/2004 |
| JP | 06-124962 | 5/1994 |
| JP | 8-250739 | 9/1996 |
| JP | 2001-102585 | 4/2001 |
| JP | 2002-64107 | 2/2002 |
| JP | 2002-83805 | 3/2002 |
| JP | 2003-174153 | 6/2003 |

OTHER PUBLICATIONS

Office Action (Application No. 200510076233.0; CN7846), Dated Jan. 23, 2009.

* cited by examiner

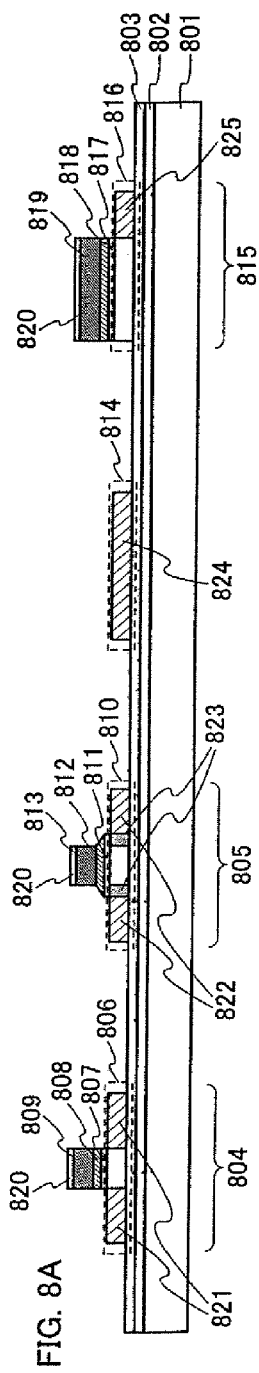
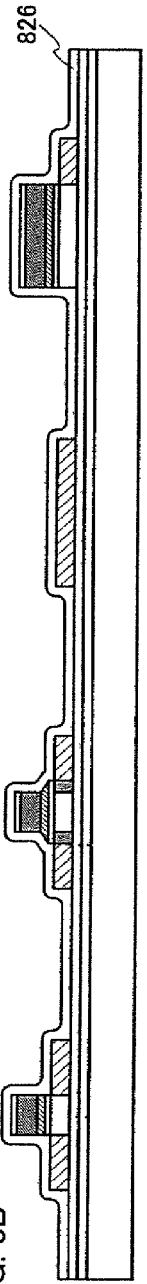
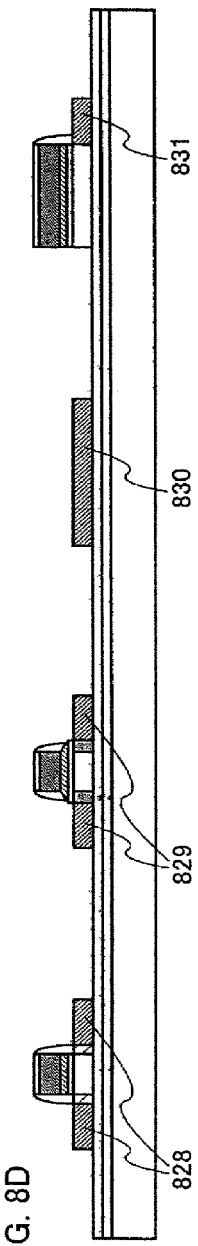
FIG. 8A
FIG. 8B
FIG. 8C
FIG. 8D

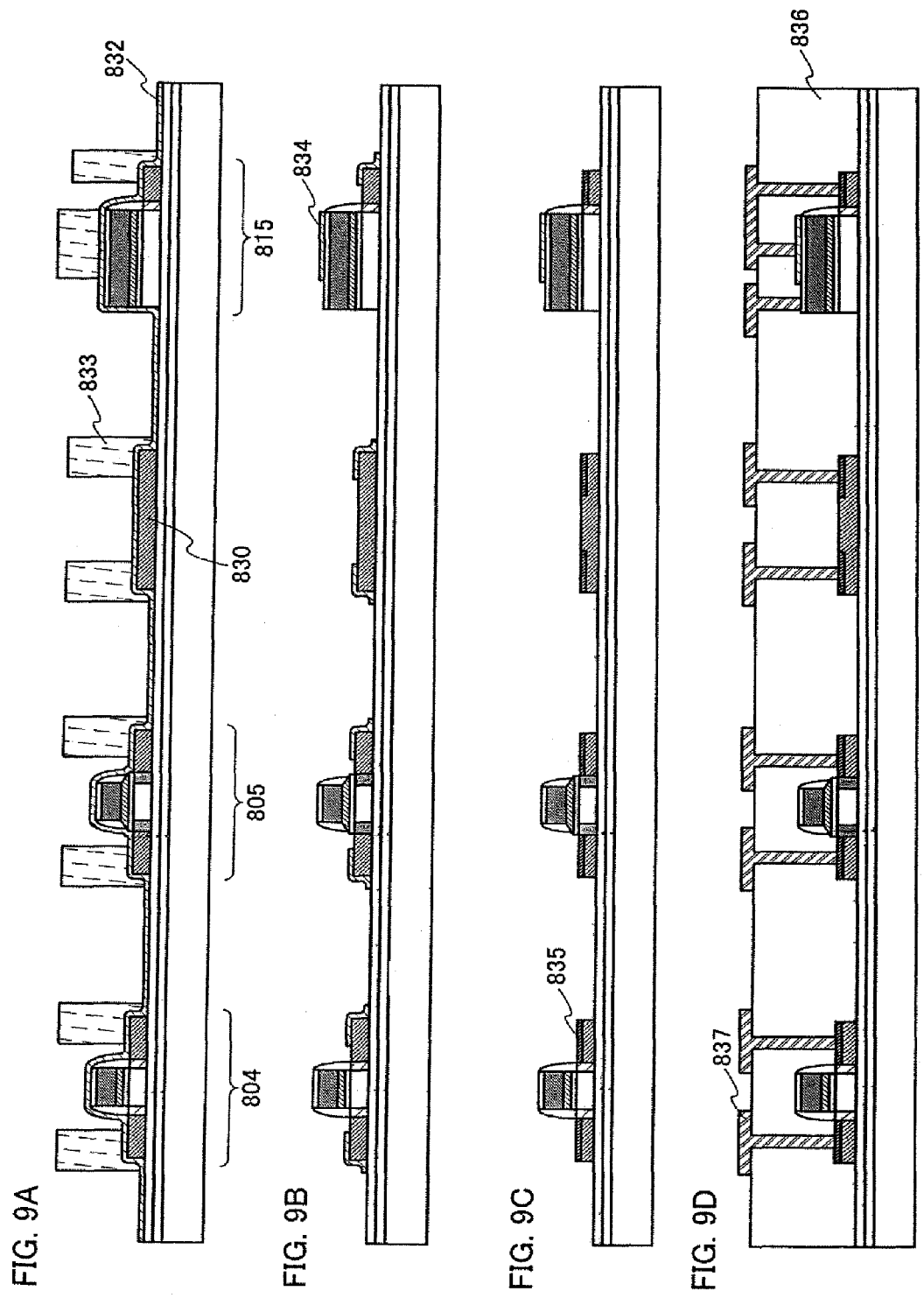

THIN FILM INTEGRATED CIRCUIT AND METHOD FOR MANUFACTURING THE SAME, CPU, MEMORY, ELECTRONIC CARD AND ELECTRONIC DEVICE

BACKGROUND OF THE INVENTION

1. Field of the Invention

The present invention relates to a thin film transistor (hereinafter, referred to as a TFT) formed over an insulating substrate such as glass, and a thin film integrated circuit including a plurality of TFTs, and a method for manufacturing the same.

2. Description of the Related Art

In order to realize high speed operation of a circuit, in a large scale integrated circuit (hereinafter, also referred to as an LSI) using a Si-wafer, a silicide is used for a source region, a drain region, and a gate electrode to lower resistance of the source region and drain region, and thus contact resistance is reduced. Salicide (Self Align Silicide) is known as a process for forming a silicide in a self-aligned manner with a diffusion layer of a MOS transistor (for example, Reference 1: Innovation of Logic LSI technology edited by Kenji Maeguchi, Masao Fukuma, Sotoju Asai, Science Forum pp. 238-241.)

FIGS. 5A to 5D each show a typical salicide process. This salicide process employs a two-step annealing method. First, a metal film 506 is formed to cover a MOS transistor including a diffusion layer 502, a field oxide film 503, a sidewall 504 and a gate electrode 505 that are each formed over a silicon substrate 501 (FIG. 5A). Ti, Co or Ni can be used for the metal film 506. As the metal film 506, TiN may be formed over the metal film to be used as an antioxidant film. After forming the metal film 506, first annealing is conducted to the MOS transistor (FIG. 5B). For the first annealing, RTA (rapid thermal annealing) is used in a nitrogen atmosphere at 600 to 750° C. in many cases. In the first annealing, a surface of the Ti film becomes TiN (not shown) due to a nitride reaction, and a metastable $TiSi_2$ layer 507 is formed at the interface between silicon and the metal film 506. Next, TiN and an unreacted metal film 508 are selectively removed by a solution of $H_2SO_4+H_2O_2+H_2O$ or $NH_4OH+H_2O_2+H_2O$ (FIG. 5C). At this step, since the $TiSi_2$ layer 507 has relatively high resistance of about 60 to 300 μΩcm, annealing of about 800 to 850° C. is conducted twice to obtain a low-resistant $TiSi_2$ layer 509 (15 to 25 μΩcm) (FIG. 5D). Since a silicide reaction is caused in $TiSi_2$ by diffusion of Si, overgrowth of silicide on a sidewall is easily caused when the temperature of the first annealing is too high, and thus the gate electrode is easily short-circuited with the source and drain regions. Accordingly, the first thermal annealing is conducted at a temperature lower than the second thermal annealing to form a high-resistant phase $TiSi_2$. After an unreacted metal film is removed, the second thermal annealing is conducted to form a low-resistant phase $TiSi_2$.

SUMMARY OF THE INVENTION

For high speed operation of a thin film integrated circuit such as a memory or a CPU formed over a glass substrate, if a salicide process employed for an LSI over a silicon wafer described above is applied to a thin film integrated circuit over a glass substrate, the second annealing for obtaining a low-resistant silicide is conducted at a higher temperature than a glass transition point. Therefore, shrinkage of the glass substrate is caused and alignment error becomes a problem. If a salicide process is conducted only by the first annealing without performing the second annealing in order to prevent the shrinkage of the glass substrate, the shrinkage of the glass substrate does not become a problem. However, since the reaction is finished just when the high-resistant phase $TiSi_2$ is formed, parasitic resistance of the source and drain regions is not sufficiently reduced.

The present invention has been made in view of the above problems. It is an object of the present invention to prevent shrinkage of a glass substrate and to manufacture a TFT on the glass substrate using a salicide process. Further, it is another object of the present invention to reduce resistance of source and drain regions of the TFT formed over the glass substrate.

The present invention provides a silicification (silicide) process that is applicable to a thin film integrated circuit over a glass substrate. In addition, the present invention also provides a process in which silicide can be formed efficiently by one-time annealing. Note that a thin film integrated circuit according to the present invention includes a TFT.

One feature of the present invention is that laser annealing is employed in conducting a silicification process to a thin film integrated circuit over a glass substrate. The glass substrate can be heated locally by laser annealing and thus a problem of a substrate shrinkage is solved.

In addition, a metal film is formed as a base film so as to increase laser absorption efficiency of a transparent glass substrate (hereinafter, referred to as a base metal film).

By using laser annealing, which can locally heat a glass substrate, in a silicification process, shrinkage of a substrate does not become a problem and parasitic capacitance of source and drain regions is reduced and thus, high speed operation of a thin film integrated circuit formed over a glass substrate is possible. Further, since a base metal film absorbs heat of laser irradiation, a semiconductor layer is supplied with heat from the base metal film in addition to laser irradiation, and thus efficiency of silicide of the source and drain regions can be increased. The temperature change of the semiconductor film is caused at a slower pace than the case where the base metal film is not provided. By the slow temperature change of the semiconductor film, a silicide reaction in the source and drains region proceeds, and lower resistance of the source and drain regions is achieved.

According to the present invention, a glass substrate that is larger and more inexpensive than a silicon wafer can be used and thus, thin film integrated circuits can be mass-produced at lower cost and with higher throughput and the production cost can be drastically reduced. In addition, a substrate can be used repeatedly in the case of adopting a process of fixing a thin film integrated circuit onto a flexible substrate from a glass substrate. Therefore, the cost of a thin film integrated circuit can be reduced.

BRIEF DESCRIPTION OF THE DRAWINGS

In the accompanying drawings:

FIGS. 8A to 8D each shows Embodiment 2;
FIGS. 9A to 9D each shows Embodiment 3.

DETAILED DESCRIPTION OF THE INVENTION

Figure 1A:
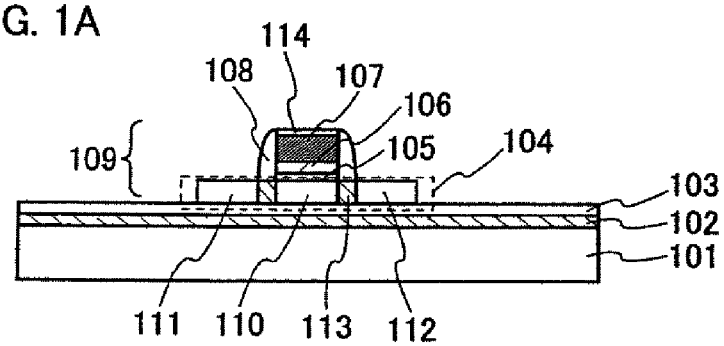
FIGS. 1A to 1E each shows steps of Embodiment Mode 1.

Embodiment Modes according to the present invention are hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Embodiment Mode 1

Embodiment Mode 1 describes a salicide process in the case of using a metal for a base film of a thin film integrated circuit. First, the present inventors have examined whether which stage in a salicide process using two-step annealing is effective for conducting laser annealing.

If second annealing for obtaining a low-resistant silicide is conducted simultaneously to the whole surface of a substrate, annealing at high-temperature of e.g., 800 to 850° C. is needed and thus shrinkage of a glass substrate becomes a problem. In view of the problem, a laser is used for the second annealing so as to locally heat the glass substrate. In this case, shrinkage of the glass substrate is not a problem; however, since laser annealing is conducted after selectively removing an unreacted metal film, the metal film as a heat-absorption layer is reduced more than in the first annealing. Thus, it is conceivable that laser absorption efficiency is low and a silicide reaction is difficult to proceed. However, if a laser is used for the first annealing, in other words, laser annealing is conducted just after forming the metal film to cover a TFT, there is a problem in that overgrowth of a silicide is caused. This is because the metal film formed on the entire surface of the substrate serves as a heat-absorption layer, temperature control is difficult and a silicide reaction proceeds too much, although the temperature of the whole substrate is efficiently increased. As the result of overgrowth of the silicide, there is a risk that a gate electrode is short-circuited with the source and drain regions.

Therefore, the present inventors have considered that it is appropriate that rapid thermal annealing (RTA) or the like that can easily control temperature is used in the first annealing of a salicide process and a laser is used in the second annealing. In this embodiment mode, laser irradiation is conducted, after the entire surface of the glass substrate is heated at such a temperature that shrinkage of the substrate is not a problem to form a high-resistant silicide and an unreacted metal film is selectively removed. In addition, a metal film (hereinafter, referred to as a base metal film) is used as a heat-absorption layer so as to increase absorption efficiency of a laser in the second annealing. Since the base metal film absorbs heat of laser irradiation, the source and drain regions of a TFT are supplied with heat from the base metal film in addition to heat from the laser.

Hereinafter, this embodiment mode is described with reference to FIGS. 1A to 1E. For a simplified description, a salicide process is conducted to a TFT having a sidewall as shown in FIG. 1A.

A base metal film 102 is formed over a glass substrate 101. An element selected from Ti, Al, Ta, W, Mo, Cu, Cr, Nd, Fe, Ni, Co, Zr, Zn, Ru, Rh, Pd, Os, Ir, and Pt, or an alloy material or a compound material mainly containing the element may be used as a material of the base metal film 102. The base metal film 102 may have a single layer structure or a laminated structure of two or more layers. Further, as the material of the base metal film 102, silicon or amorphous silicon may be used.

Then, a base insulating film 103 is formed over the base metal film 102. A single film or laminated films of silicon oxide, silicon nitride, silicon oxynitride or the like may be employed as the base insulating film.

Figure 1B:
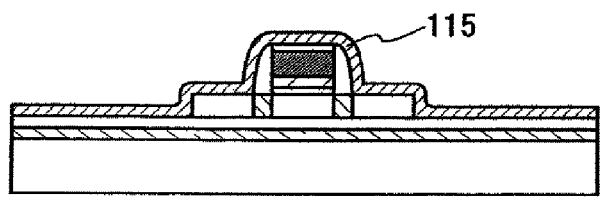

Then, a TFT 109 having a sidewall 108 is formed over the base insulating film (FIG. 1A). The TFT 109 includes a semiconductor layer 104, a gate insulating film 105, and a gate electrode including a first conductive layer 106 and a second conductive layer 107. A channel formation region 110, a source region 111, a drain region 112 and an LDD region 113 are included in the semiconductor layer 104. An insulating film 114 such as silicon oxide is formed over the second conductive layer 107, and the insulating layer 114 prevents the gate electrode from contacting a metal film to be formed in a later step. Then, a metal film 115 is formed to cover the TFT 109 by a sputtering method. A high-meting point metal such as Ti, Co or Ni of may be used for the metal film 115, and Ti is used in this embodiment mode. TiN (not shown) may be formed over the metal film 115 as an antioxidant film (FIG. 1B). When the antioxidant film is formed, Ti may be formed by a sputtering method and then TiN may be formed sequentially by a reactive sputtering method. Note that a CVD method may be employed for forming the metal film and the antioxidant film.

Figure 1C:
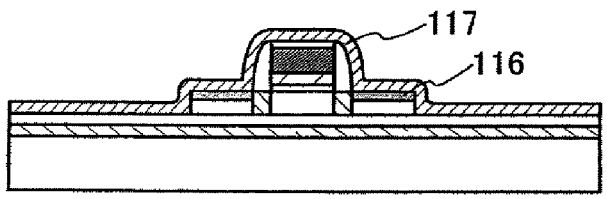

By adopting RTA or the like, the first annealing is conducted at such a temperature that does not cause shrinkage of a substrate (680° C. or lower, preferably 650° C. or lower) to form a high-resistant $TiSi_2$ layer 116. In the case where the annealing temperature is too high, the annealing should be conducted with care. This is because there is a risk that the silicide is grown over the sidewall and thus the gate electrode is short-circuited with the source and drain regions, since the silicide reaction proceeds too much by the high temperature (FIG. 1C).

Figure 1D:
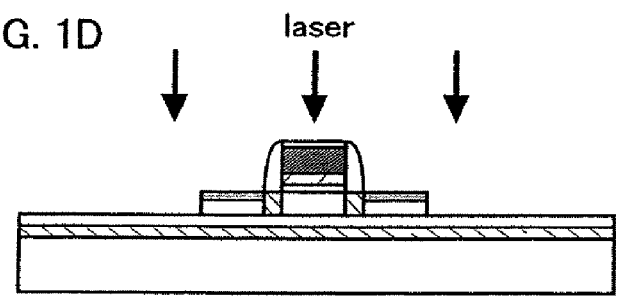
Figure 1E:
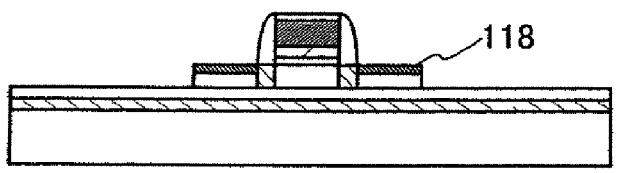

After the first annealing is finished, an unreacted metal film 117 is removed by a mixed solution of ammonia water and hydrogen peroxide solution or the like and laser irradiation is conducted as the second annealing (FIG. 1D). An excimer laser, a solid-state laser (fundamental wave, preferably a harmonic; for example, laser light of wavelength: 1064 nm, preferably 532 nm) and the like can be used. A silicide reaction proceeds in the high-resistant $TiSi_2$ 116 layer by laser annealing, and thus the high-resistant $TiSi_2$ 116 layer becomes a low-resistant $TiSi_2$ layer 118 (FIG. 1E). In addition, since the base metal film 102 absorbs heat of laser irradiation in the second annealing, the semiconductor layer 104 is supplied with heat from the base metal film 102 in addition to heat from the laser irradiation, and the efficiency of a silicide reaction in the source and drain regions 111 and 112 can be enhanced. Although metals have high thermal conductivity and thus heat is radiated from the semiconductor film due to the base metal film, heat is supplied to the semiconductor film from the base metal film since the base metal film itself absorbs heat. The temperature of the semiconductor film is changed slowly and thus the silicide reaction proceeds in the source and drain regions, thereby obtaining lower resistance.

Embodiment Mode 2

Embodiment Mode 2 describes a mode where the salicide process described in Embodiment Mode 1 is applied to a process of fixing a thin film integrated circuit to a flexible substrate such as plastic.

As a substrate over which a separation layer including a thin film integrated circuit, a glass substrate, a quartz substrate, a semiconductor substrate, a ceramic substrate, a metal substrate or the like can be used, and a glass substrate is used in this embodiment mode. This is because a glass substrate is more inexpensive than the other substrates and further, the size of the substrate can be enlarged. Therefore, a plurality of display devices or thin film integrated circuits can be manufactured simultaneously from one large glass substrate, and display devices or thin film integrated circuits can be mass-produced at a lower cost with higher throughput. Moreover, a glass substrate can be applied to a lager and larger screen of a display device.

Figure 2A:
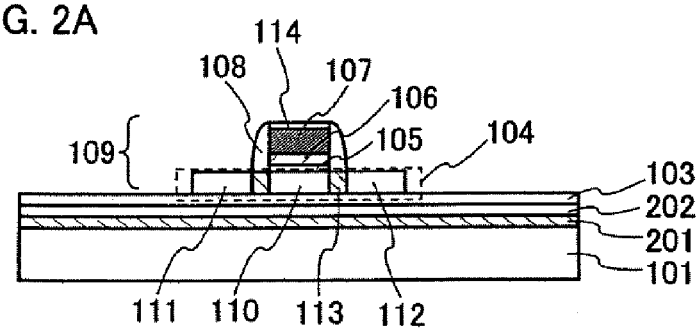
FIGS. 2A to 2E each shows steps of Embodiment Mode 2.

Hereinafter, this embodiment mode is described with reference to FIGS. 2A to 2E and FIGS. 3A to 3D. For a simplified description, a salicide process is conducted to a TFT having a sidewall as shown in FIG. 2A, and a separated separation layer including a thin film integrated circuit is fixed onto a flexible substrate.

A separation film 201 is formed over the glass substrate. An element selected from Ti, Al, Ta, W, Mo, Cu, Cr, Nd, Fe, Ni, Co, Zr, Zn, Ru, Rh, Pd, Os, Ir, and Pt, or an alloy material or a compound material mainly containing the element may be used as a material of the separation film 201. The separation film 201 may have a single layer structure or a laminated structure of two or more layers.

Then, an oxide film 202, a base insulating film 103 and a TFT having a sidewall are sequentially formed over the separation film 201. Elements except the separation film 201 and the oxide film 202 are identical to those in Embodiment Mode 1, and thus, the description thereof is omitted and the same reference numerals are used for the identical elements (FIG. 2A).

Figure 2B:
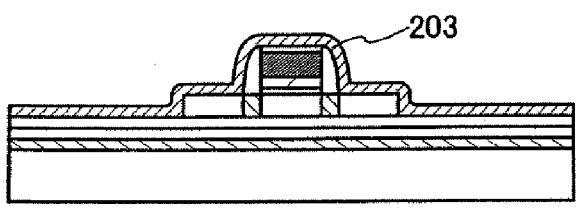

A metal film 203 is formed to cover a TFT 109 by a sputtering method. A high-meting point metal such as Ti, Co or Ni of may be used for the metal film 203, and Ti is used in this embodiment mode. TiN (not shown) may be formed over the metal film 203 as an antioxidant film (FIG. 2B). When the antioxidant film is formed, Ti may be formed by a sputtering method and then TiN may be formed sequentially by a reactive sputtering method. Note that a CVD method may be employed for forming the metal film and the antioxidant film.

Figure 2C:
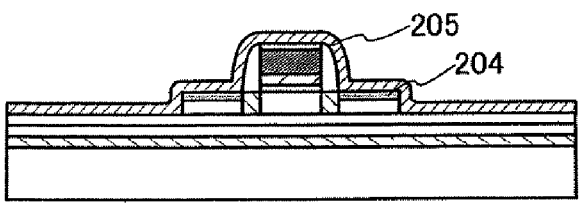

By adopting RTA or the like, the first annealing is conducted at such a temperature that does not cause shrinkage of the substrate to form a high-resistant $TiSi_2$ layer 204. In the case where the annealing temperature is too high, the annealing should be conducted with care. This is because there is a risk that the silicide is grown over the sidewall and thus the gate electrode is short-circuited with the source and drain regions, since the silicide reaction progresses too much by the high temperature (FIG. 2C).

Figure 2D:
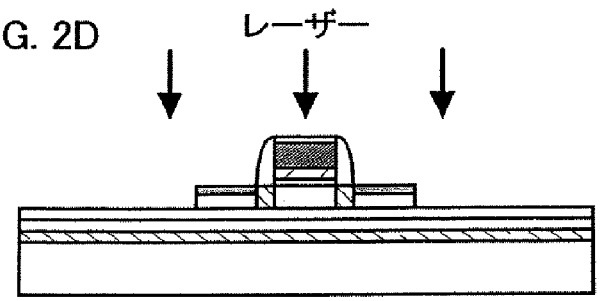
Figure 2E:
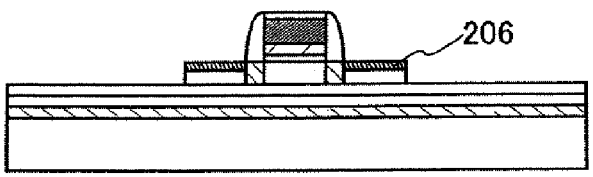

After the first annealing is finished, an unreacted metal film 205 is removed by a mixed solution of ammonia water and hydrogen peroxide solution or the like and laser irradiation is conducted as the second annealing (FIG. 2D). An excimer laser, a solid-state laser (wavelength: 1064 nm or 532 nm) and the like can be used. A silicide reaction proceeds in the high-resistant $TiSi_2$ layer 204 by laser annealing, and thus the high-resistant $TiSi_2$ layer 204 becomes the low-resistant $TiSi_2$ layer 206 (FIG. 2E). In addition, since the separation film 201 absorbs heat of laser irradiation in the second annealing, the semiconductor layer 104 is supplied with heat from the separation film 201 in addition to heat from the laser irradiation, and the efficiency of a silicide reaction in the source and drain regions 111 and 112 can be enhanced. Although metals have high thermal conductivity and thus heat is radiated from the semiconductor film due to the base metal film, beat is supplied to the semiconductor film from the base metal film since the base metal film itself absorbs heat. The temperature of the semiconductor film is changed slowly, and thus a silicide reaction proceeds in the source and drain regions, thereby obtaining lower resistance.

A thermal activation of an impurity region such as the source and drain regions may be conducted. For example, after a SiON film of 50 nm thick (not shown) is formed to cover the TFT, a heat treatment may be conducted at 550° C. for four hours in a nitrogen atmosphere.

In addition, after a SiNx film (not shown) containing hydrogen of 100 nm thick is formed, a heat treatment is conducted at 410° C. for one hour in a nitrogen atmosphere to repair defects of the semiconductor film. This is, for example, a step of terminating dangling bonds inside crystalline silicon and also referred to as a hydrogenation treatment step. Thereafter, a SiON film of 600 nm thick (not shown) may be formed as an interlayer insulating film for protecting a TFT. In this case, three insulating films in which SiON, SiNx and SiON are stacked sequentially are formed; however, the structure and materials thereof are not limited thereto.

Next, a material mainly containing an inorganic material (such as silicon oxide, silicon nitride, or silicon oxynitride), or an organic material (polyimide, acryl, polyamide, polyimide amide, benzocyclobutene or siloxane may be used to form an interlayer insulating film 207 to cover the TFT 109. Siloxane has a skeleton structure with a bond of silicon (Si) and oxygen (O). As a substituent thereof, an organic group including at least hydrogen (such as an alkyl group or an aromatic hydrocarbon) is used. Further, a fluoro group may be used for the substituent. Also, an organic group including at least hydrogen and a fluoro group may be used for the substituent. Note that here, DLC (diamond like carbon), a silicon oxide film, a silicon nitride film, or a silicon nitride oxide film or the like may be formed as a protective film (not shown) over the interlayer insulating film 207 by a plasma CVD method, an atmospheric pressure plasma method or the like.

Figure 3A:
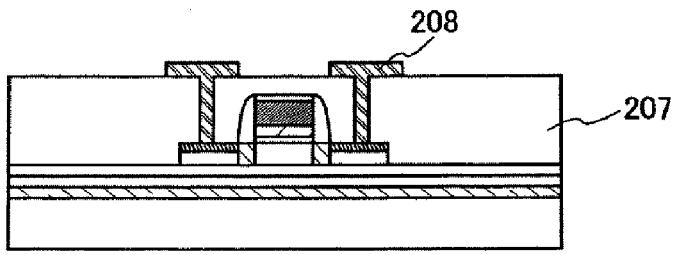
FIGS. 3A to 3D each shows steps of Embodiment Mode 2.

Then, a contact hole is formed in a desired region of the interlayer insulating film 207, and a conductive film of Al, Ti, Mo, W or the like is formed to fill the contact hole, and the conductive film is etched into a desired shape to form a source and drain electrode 208 (FIG. 3A).

Figure 3B:
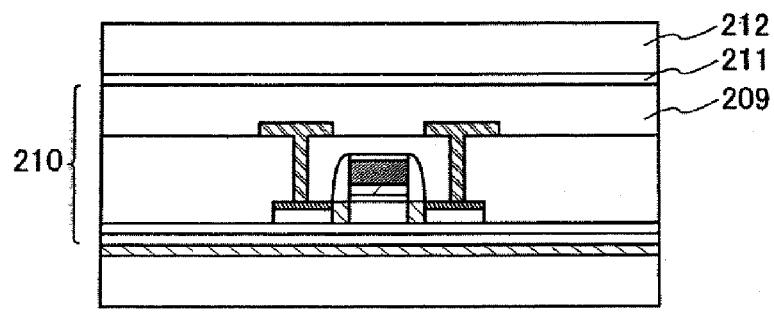

A passivation film 209 is formed to cover the interlayer insulating film 207 and the source and drain electrode 208 and serves as a separation layer 210. After that, a support medium 212 is attached onto the passivation film 209 with an adhesive layer 211 such as an epoxy resin or the like. A material mainly containing an inorganic material (such as silicon oxide, silicon nitride, or silicon oxynitride), or an organic material (polyimide, acryl, polyamide, polyimide amide, benzocyclobutene or siloxane may be used as the passivation film. Siloxane has a skeleton structure with a bond of silicon (Si) and oxygen (O). As a substituent thereof, an organic group including at least hydrogen (such as alkyl group or aromatic hydrocarbon) is used. Further, a fluoro group may be used for the substituent. Also, an organic group including at least hydrogen and a fluoro group may be used for the substituent. A resin substrate of 10 μm or more, for example, PES (polyethersulfone), PC (polycarbonate), PET (polyethylene terephthalate) or PEN (polyethylene naphthalate) may be used as the support medium (FIG. 3B).

Figure 3C:
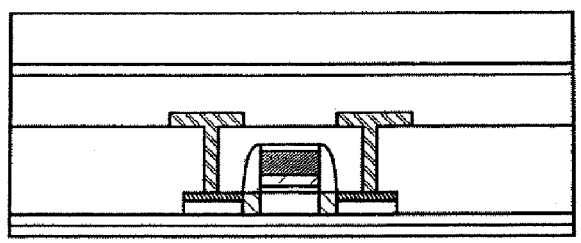

A substrate provided with the separation film 201 is separated from the separation layer 210 by a physical means or a chemical means (FIG. 3C). The film stress of the separation film 201 is different from that of the oxide film 202, and thus the films can be separated from each other with relatively small force. Note that the separation film may be removed by a physical means using halogen fluoride (chemical formula: XFn, X is halogen other than fluorine and n is an integer number) or the like. As the method for separating the separation film by spraying halogen fluoride thereto, there can be employed a method of discharging streams of pressurized water from a nozzle (called water jet method) or a method of discharging a high-pressure gas stream. At the time, organic solvent, acid solution or alkaline solution may be employed instead of water. Further, air, a nitrogen gas, a carbon dioxide gas or a rare gas may be used, or plasma of these gases may be used for the gas. Note that a heat treatment or laser irradiation may be conducted so as to promote separation.

Figure 3D:
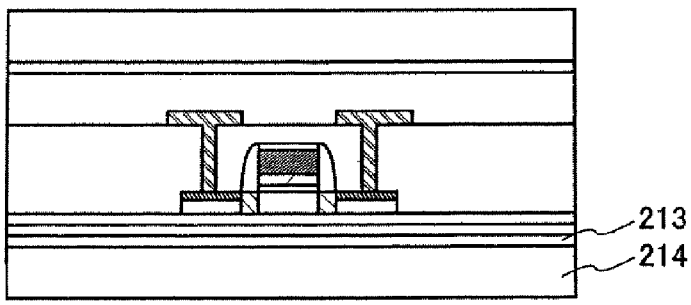

Then, a transfer medium 214 made of plastic such as PES (polyethersulfone), PC (polycarbonate), PET (polyethylene terephthalate), PEN (polyethylene naphthalate) is attached onto the separation layer 210 by an adhesive layer 213 made of epoxy resin or the like (FIG. 3D). Note that the support medium and the transfer body are not limited to the materials described above, as long as the support medium and the transfer body are flexible.

In this embodiment mode, the separation film also serves as an absorption layer of laser light. In other words, the separation film of this embodiment mode serves as an absorption layer of laser light in the salicide process and as a separation film in the process of fixing a thin film integrated circuit onto a flexible substrate. By using the separation film as the base metal film, a salicide process can be performed without adding a new step.

Note that a display element such as a liquid crystal or EL (electroluminescence) may be provided between the support medium 212 and the separation layer 210.

Further, a wiring (not shown) may be provided over the passivation film 209, or over an interlayer insulating film that is formed instead of the passivation film, so that the wiring is connected to the source electrode or the drain electrode through a contact hole formed in the interlayer insulating film. In other words, a structure (multilayer wiring) in which wirings formed in different layers are connected to one another through insulating films, may be employed.

Embodiment Mode 3

Embodiment Mode 3 describes a mode where a silicification process can be conducted efficiently by one-time annealing in a thin film integrated circuit over a glass substrate with reference to FIGS. 4A to 4D. Note that a TFT having a sidewall over the glass substrate is identical to that of Embodiment Mode 1, and thus the description thereof is omitted and shown by the same reference numeral.

Figure 4A:
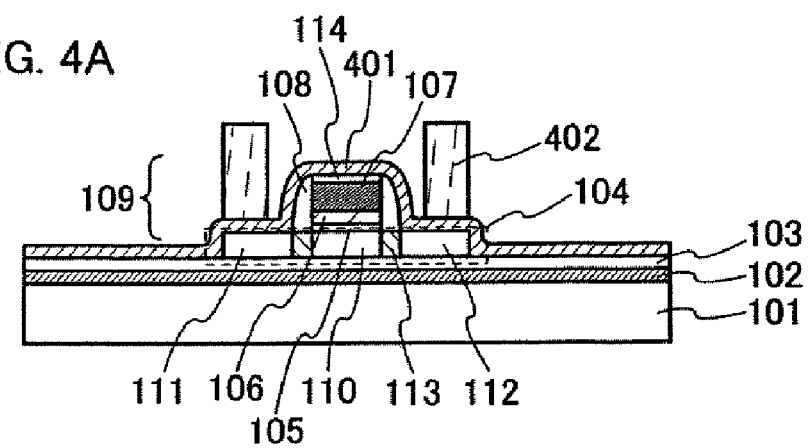
FIGS. 4A to 4D each shows steps of Embodiment Mode 3.
Figure 4B:
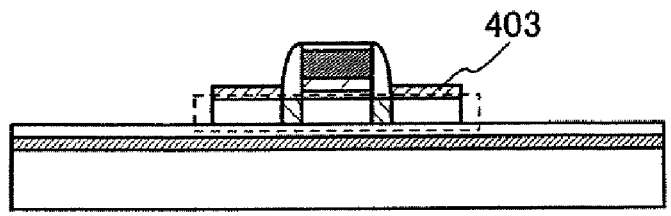
Figure 4C:
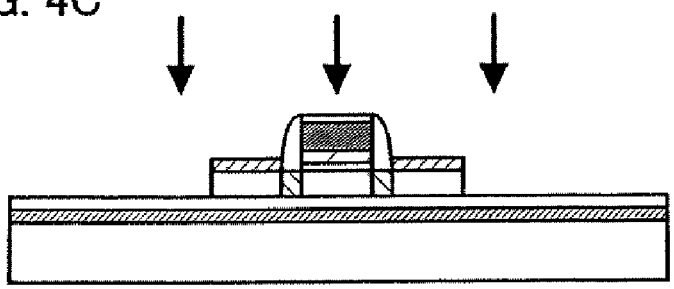

A metal film 401 is formed to cover the TFT 109, and a resist 402 is formed over source and drain regions to be silicified (FIG. 4A). The metal film 401 is selectively removed by a mixed solution of ammonia water and hydrogen peroxide solution or the like, thereby partially leaving the metal film 403 over the source and drain regions as shown in FIG. 4B. Then, silicification of the source and drain regions is conducted by laser annealing (FIG. 4C). An excimer laser, a solid-state laser (wavelength: 1064 nm or 532 nm) and the like can be used. If the TFT 109 is formed on the front surface of a substrate, the front surface or the rear surface of the substrate may be irradiated with laser light.

Figure 4D:
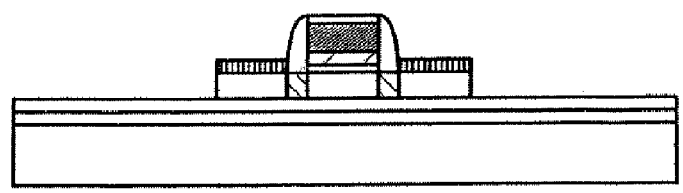
Figure 5A:
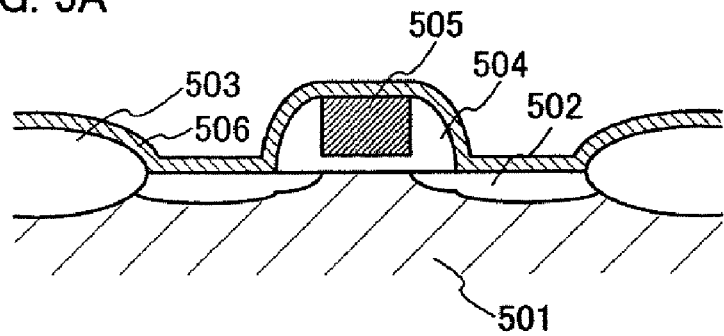
FIGS. 5A to 5D each shows steps of a conventional example.
Figure 5B:
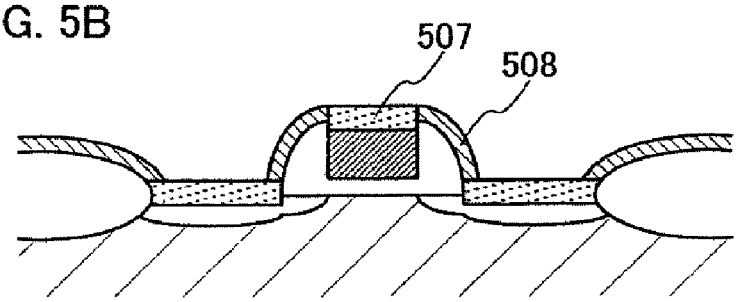
Figure 5C:
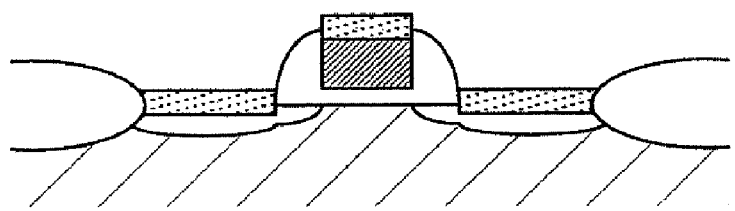
Figure 5D:
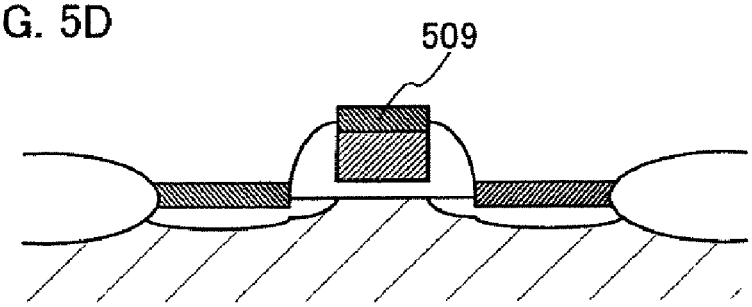

During the laser annealing, a base metal film 102 absorbs heat of laser irradiation, a semiconductor layer 104 is supplied with heat from a separation film 102 in addition to heat from the laser irradiation, and the efficiency of a silicide reaction in source and drain regions 111 and 112 can be enhanced (FIG. 4D). Although metals have high thermal conductivity and thus heat is radiated from the semiconductor film due to the base metal film, heat is supplied to the semiconductor film from the base metal film since the base metal film itself absorbs heat. The temperature of the semiconductor film is changed slowly, and thus a silicide reaction proceeds in the source and drain regions, thereby obtaining lower resistance.

Note that, in Embodiment Modes 1 to 3, impurities added into the source and drain regions can be thermal-activated efficiently, by using a base film of a metal (a separation film in Embodiment Mode 2), even if the source and drain regions are not silicified. If a silicide is not formed, since a metal film is not formed over the entire surface of the substrate to cover a TFT, a glass substrate originally has poor absorption efficiency of heat to RTA treatment or the like using a lamp heating, and is not heated sufficiently. However, as in Embodiment Modes 1 to 3, when a metal film is formed as a base film, temperature can be efficiently increased rapidly in a short time by a lamp.

Embodiment 1

Embodiment 1 describes a specific manufacturing method of a thin film integrated circuit device including a TFT with reference to FIGS. 6A to 6E and 7A to 7C. Here, a cross-sectional view of a CPU and a memory unit using an n-channel type TFT and a p-channel type TFT is shown for simplification and a manufacturing method thereof is described.

A base metal film 602 is formed over a glass substrate 601. For example, 1737 substrate manufactured by Corning Incorporated is used as the glass substrate. An element selected from Ti, Al, Ta, W, Mo, Cu, Cr, Nd, Fe, Ni, Co, Zr, Zn, Ru, Rh, Pd, Os, Ir, and Pt, or an alloy material or a compound material containing mainly the element may be used as a material of the base metal film 602. The base metal film 602 may have a single layer structure or a laminated structure of two or more layers.

Then, an oxide film 603 is formed over the base metal film 602. A single layer or a laminated layer of silicon oxide, silicon oxynitride or a metal oxide material may be used as the oxide film 603. Note that the oxide film 603 may be formed by a sputtering method, a plasma CVD method, a coating method or the like.

Figure 6A:
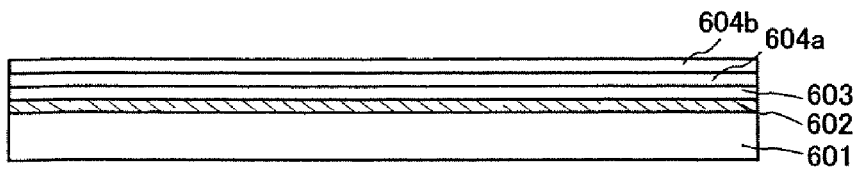
FIGS. 6A to 6E each shows Embodiment 1.

Base insulating films 604a and 604b are formed over the oxide film 603. Here, a silicon oxynitride film (composition ratio Si=32%, O=27%, N=24%, H=17%) of 50 nm thick (preferably 10 to 200 nm thick) is formed using $SiH_4$, $NH_3$ and $N_2O$ as material gases at a deposition temperature of 400° C. by a plasma CVD method. Moreover, a silicon oxynitride film (composition ratio Si=32%, O=59%, N=7%, H=2%) of 100 nm thick (preferably 50 to 200 nm thick) is formed using $SiH_4$ and $N_2O$ as material gases at a deposition temperature of 400° C. by a plasma CVD) method. The both silicon oxynitride films are stacked as the base insulating film. Alternatively, the base insulating film may have a single layer structure or a laminated structure of three or more layers, without being limited to the above described structure (FIG. 6A).

Then, a semiconductor film is formed over the base insulating film 604b. As a material of the semiconductor film, silicon or a silicon germanium alloy ($Si_xGe_{1-x}$ (x=0.0001 to 0.02)) or the like is used and the semiconductor film may be formed by a known method (such as a sputtering method, an LPCVD method or a plasma CVD method).

Then, a nickel acetate salt solution containing nickel of 10 ppm by weight is coated by a spinner, and a heat treatment is conducted to form a semiconductor film having a crystal structure. Instead of coating, a nickel element may be sprayed over an entire surface by a sputtering method, or other known crystallization methods, e.g., a solid-phase epitaxy method and a laser crystallization method may be adopted.

Herein, laser irradiation may be conducted in the atmosphere or an oxygen atmosphere to repair defects in crystal grains and enhance crystallinity. As laser light, excimer laser light of 400 nm or less in wavelength, a second or third harmonic of a YAG laser is employed.

A crystalline silicon semiconductor film is obtained by the above method. After that, an amorphous silicon film is formed over the semiconductor film through an oxide film and gettering of a metal catalyst may be conducted by a heat treatment of 500 to 750° C. Then, the semiconductor film is etched using a resist mask to form an island-like semiconductor layer 605.

Figure 6B:
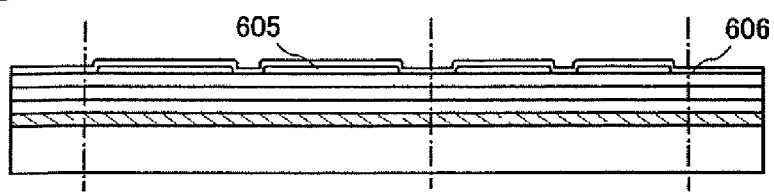

Then, a gate insulating film 606 is formed over the semiconductor layer. The gate insulating film is formed from a film containing silicon nitride, silicon oxide, silicon nitride oxide or silicon oxynitride as a single layer or a laminated layer by a plasma CVD method, a sputtering method or the like (FIG. 6B).

Figure 6C:
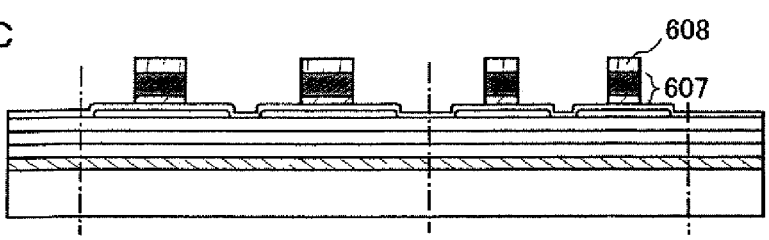

A gate electrode 607 is formed. Here, an element selected from Ta, W, Ti, and Mo or an alloy material or a compound material mainly containing the element is laminated by a sputtering method, and then etching is conducted by using a resist 608 as a mask to form the gate electrode 607. The material, structure and manufacturing method of the gate electrode are not limited thereto, and can be selected appropriately. The gate electrode may have a single layer structure or a laminated structure of two or more layers (FIG. 6C).

Figure 6D:
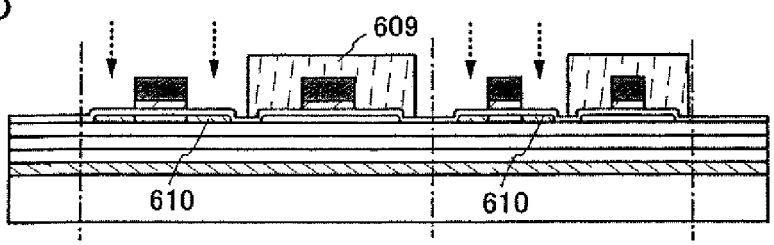

Next, a portion to become a p-channel type TFT is covered with a resist 609, and an island-like semiconductor layer of an n-channel type TFT is doped with an impurity element imparting an n-type conductivity (phosphorus (P) or arsenic (As)) to form a low concentration impurity region using the gate electrode as a mask (a first doping step). The conditions of the first doping step such as a dose amount and an accelerating voltage are adjusted appropriately so that the low concentration impurity region of $5 \times 10^{17}$ to $5 \times 10^{18}$ cm$^3$ can be formed. For example, the dose amount is $1 \times 10^{13}$ to $6 \times 10^{13}$/cm$^2$, and the accelerating voltage is 50 to 70 keV when the gate insulating film is 15 to 20 nm thick. A pair of low concentration impurity regions 610 is formed by doping through the gate insulating film by performing this first doping step (FIG. 6D).

Figure 6E:
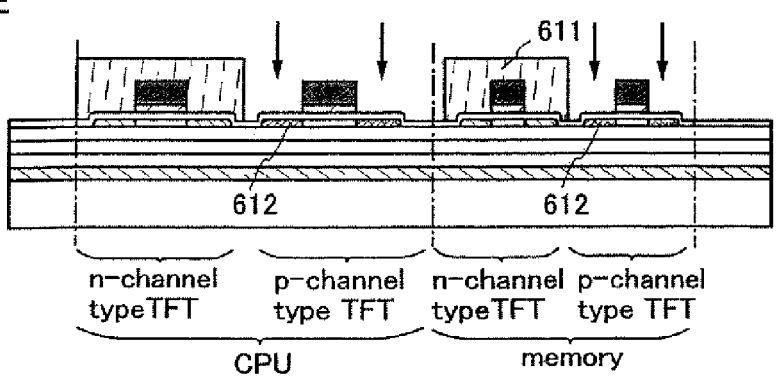

Next, after the resist is removed by ashing or the like, a new resist 611 is formed to cover a region of the n-channel type TFT. An impurity element imparting a p-type conductivity is added into an island-like semiconductor layer of the p-channel type TFT to form a high concentration impurity region using the gate electrode as a mask (a second doping step). The conditions of the second doping step such as a dose amount and an accelerating voltage are adjusted appropriately so that the p-type impurity region of $1 \times 10^{19}$ to $5 \times 10^{21}$/cm$^3$ can be formed. For example, the dose amount is $1 \times 10^{16}$ to $3 \times 10^{16}$/cm$^2$, and the accelerating voltage is 20 to 40 keV when the gate insulating film is 15 to 20 nm thick. A pair of p-type high concentration impurity regions 612 is formed by doping of the p-type impurity element through the gate insulating film by performing the second doping step (FIG. 6E).

Figure 7A:
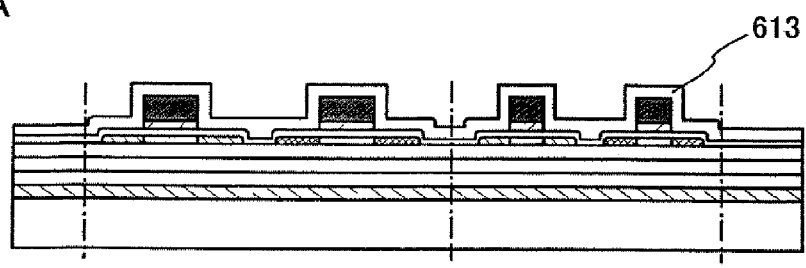
FIGS. 7A to 7C each shows Embodiment 1.
Figure 7B:
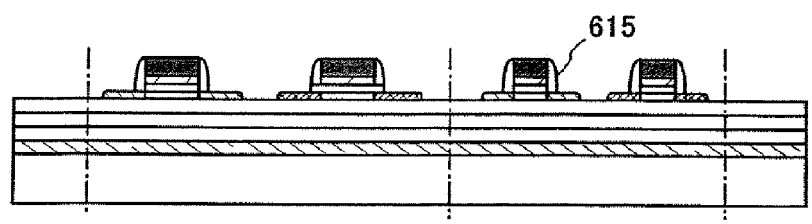

Next, after the resist is removed by ashing or the like, an insulating film 613 is formed over a surface of the substrate (FIG. 7A). A SiO$_2$ film of 200 to 300 nm thick may be formed by a plasma CVD method as the insulating film 613. After that, the insulating film 613 and the gate insulating film 606 are etched partially by an etchback method to form a sidewall 615 in a self-alignment manner. A mixture gas of CHF$_3$ and He may be employed as an etching gas. Note that the step of forming the sidewall is not limited thereto (FIG. 7B).

Figure 7C:
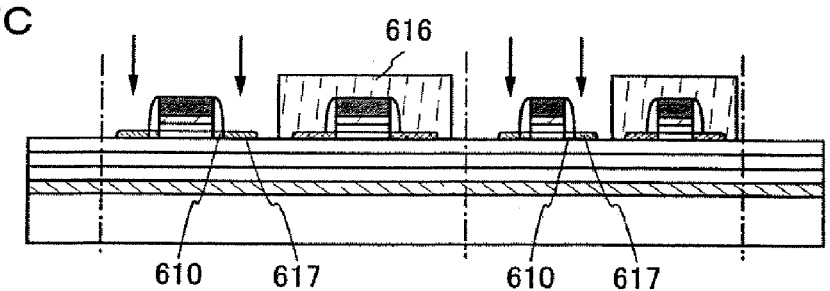

A new resist 616 is formed to cover a p-type channel TFT, and an impurity element imparting n-type conductivity (such as P or As) is added to form a high concentration region using the gate electrode 607 and the sidewall 615 as masks (a third doping step). The conditions of the third doping step such as a dose amount and an accelerating voltage are adjusted appropriately so that the n-type impurity region of $1 \times 10^{18}$ to $1 \times 10^{20}$/cm$^3$ can be formed. For example, the dose amount is $1 \times 10^{13}$ to $5 \times 10^{15}$/cm$^2$, and the accelerating voltage is 20 to 50 keV. A pair of n-type high concentration impurity regions 617 is formed by performing the third doping step (FIG. 7C).

Note that herein a silicide reaction described in Embodiment Modes 1 to 3 may also be conducted. This embodiment can be combined freely with Embodiment Modes 1 to 3.

Through the above described steps, the n-channel type TFT and the p-channel type TFT constituting parts of a CPU and a memory can be formed over the glass substrate 601.

Embodiment 2

In Embodiment 2, a plurality of TFTs having different structures, a resistor and a capacitor are mounted together on the same substrate. Embodiment 2 describes an example of conducting a silicification thereof to reduce parasitic resistance with reference to FIGS. 5A to 8D and 9A to 9D. Specifically, Embodiment 2 describes an example in which a high-speed TFT having a silicide formed in source and drain regions and a parasitic resistance which is reduced as much as possible (which is used for a CPU or a memory); a TFT having a structure for preventing reduction of ON current value due to hot-carrier injection (pixel TFT); a resistor formed by adding impurities into silicon; and a stacked type capacitor are mounted together.

As shown in FIG. 8A, a base metal film 802, a base insulating film 803, and TFTs 804 and 805 having a structure different from each other over the base insulating film 803 are formed over a glass substrate 801. In FIG. 8A, the TFT 804 includes a semiconductor layer 806, a gate insulating film 807, a gate electrode including a first conductive layer 808 and a second conductive layer 809, and the TFT 805 includes a semiconductor layer 810, a gate insulating film 811 and a gate electrode including a first conductive layer 812 and a second conductive layer 813. A semiconductor layer 814 constitutes a resistor to be formed later and is formed at the same step as semiconductor layers 806 and 810. A capacitor 815 includes a semiconductor layer 816, an insulating film 817, a first conductive layer 818 and a second conductive layer 819, which are each formed in the same step as the semiconductor layers 806, 810, 814, and 816, the gate insulating films 807, 811 and 817, and the first conductive layers 808, 812 and 818, and the second conductive layers 809, 813 and 819. Insulating films 820 (silicon oxide) over the second conductive layers 809, 813 and 819 are also formed in the same step. Note that the shape of the first conductive layer 812 is different from that of the first conductive layer 808. However, the description thereof is omitted here, since a manufacturing method of the TFT 805 may be referred to, for example, as in Japanese Patent Laid-Open No. 2002-83805 or Japanese Patent Laid-Open No. 2002-64107 and a manufacturing method of the TFT 804 is similar to that in Embodiment 1. The forming methods and materials of the semiconductor layers, the gate insulating films and the conductive layers are also similar to those in Embodiment 1.

Next, an impurity element imparting an n-type or p-type conductivity is added into the semiconductor layers 806, 810, 814 and 816 to form a low concentration impurity region using the gate electrodes of the TFTs 804 and 805 and the first and second conductive layers 818 and 819 as masks (a first doping step). The conditions of the first doping step such as a dose amount and an accelerating voltage are adjusted appropriately so that the low concentration impurity region of $5\times10^{17}$ to $5\times10^{18}/cm^3$ can be formed. For example, the dose amount is $1\times10^{13}$ to $6\times10^{13}/cm^2$, and the accelerating voltage is 50 to 70 keV when the gate insulating film is 15 to 20 nm thick. A pair of low concentration impurity regions 821 in the semiconductor layer 806; pairs of low concentration impurity regions 822 (n⁻ or p⁻) and 823 (n⁻ or p⁻) in the semiconductor layer 810; pairs of low concentration impurity regions 824 and 825 in the semiconductor layers 814 and 815 are formed respectively by performing this first doping step.

Then, an insulating film 826 is formed as shown in FIG. 8B. A $SiO_2$ film of 200 to 300 nm thick may be formed by a plasma CVD method as the insulating film 826. After that, the insulating film 826 is partially removed by an etchback method to form a sidewall 827 in a self-alignment manner. A mixture gas of $CHF_3$ and He may be employed as an etching gas. Note that the step of forming the sidewall is not limited thereto.

The same impurity element as that of the first doping step is added into the semiconductor layers 806, 810, 814 and 816 to form a high concentration impurity region using the gate electrodes of the TFTs 804 and 805, the first and second conductive layers 818 and 819 and the sidewall 827 as masks (a second doping step). The conditions of the second doping step such as a dose amount and an accelerating voltage are adjusted appropriately so that the impurity region of $1\times10^{18}$ to $1\times10^{20}/cm^3$ can be formed. For example, the dose amount is $1\times10^{13}$ to $5\times10^{15}/cm^2$, and the accelerating voltage is 20 to 50 keV, Pairs of high concentration impurity regions 828 and 829, and high concentration impurity regions 830 and 831 are formed by performing the second doping step (FIG. 8D).

As shown in FIG. 9A, a metal film 832 is formed to cover the TFTs 804 and 805, the high concentration impurity region 830 and the capacitor 815, and then a resist mask 833 is partially formed. Ti, Co or Ni may be used as the metal film 832, and Ti is used in this embodiment. TiN (not shown) may be formed over the metal film 832 to be used as an antioxidant film.

As shown in FIG. 9B, the metal film 832 is selectively removed by etching using the resist mask 833 and a mixed solution of ammonia water and hydrogen peroxide solution or the like. At this time, the metal film is selectively left on the insulating film 820 of the capacitor 815 as well as on a region to be silicified. The metal film 834 on the insulating film 820 of the capacitor 815 becomes an electrode of a stacked type capacitor.

Subsequently, a silicide reaction is conducted by laser annealing. An excimer laser, a solid-state laser (wavelength: 1064 nm or 532 nm) and the like can be used. If a TFT is formed on the front surface of a substrate, the front surface or the rear surface of the substrate may be irradiated with laser light. In laser annealing, since the base metal film 802 absorbs heat of laser irradiation, the semiconductor layers 806, 810, 814 and 816 are supplied with heat from the base metal film 802 in addition to heat from laser irradiation, and thus the efficiency of the silicide reaction of the high concentration impurity regions 828, 829, 830 and 831 can be increased. In this way, a low-resistant $TiSi_2$ layer 835 is formed (FIG. 9C).

This embodiment shows an example in which the metal film is partially formed over the semiconductor layer as in Embodiment Mode 3 and a silicification is performed by one-time annealing. However, this embodiment is not limited thereto and can be combined freely with Embodiment Mode 1 or 2. As in Embodiment Modes 1 and 2, annealing may be performed twice to form a silicide.

Here, an impurity region such as the source and drain regions may be activated thermally. For example, after a SiON film of 50 nm thick (not shown) is formed to cover the TFT, a heat treatment may be conducted at 550° C. for four hours in a nitrogen atmosphere. In addition, after a SiNx film containing hydrogen of 100 nm thick (not shown) is formed, a heat treatment is conducted at 410° C. for one hour in a nitrogen atmosphere to repair defects of the semiconductor film. This is, for example, a step of terminating dangling bonds inside crystalline silicon and also referred to as a hydrogenation treatment step. Thereafter, a SiON film of 600 nm thick (not shown) may be formed as an interlayer insulating film. In this case, an insulating film having a three-layer structure in which SiON, SiNx and SiON are stacked sequentially is formed over a TFT; however, the structure and materials thereof are not limited thereto.

Next, a material mainly containing an inorganic material (such as silicon oxide, silicon nitride, or silicon oxynitride), or an organic material (polyimide, acrylic, polyamide, polyimide amide, benzocyclobutene or siloxane) may be used to form an interlayer insulating film 836 to cover the TFTs 804 and 805, the high concentration impurity region 830 and the capacitor 815. Siloxane has a skeleton structure with a bond of silicon (Si) and oxygen (O). As a substituent thereof, an organic group including at least hydrogen (such as alkyl group or aromatic hydrocarbon) is used. Further, a fluoro group may be used for the substituent. Also, an organic group including at least hydrogen and a fluoro group may be used for the substituent. Note that here, DLC (diamond like carbon), a silicon oxide film, a silicon nitride film, or a silicon nitride oxide film or the like may be formed as the protective film (not shown) over the interlayer insulating film 836 by a plasma CVD method, an atmospheric pressure plasma method or the like.

Then, a contact hole is formed in a desired region of the interlayer insulating film 836, a conductive film of Al, Ti, Mo, W or the like is formed to fill the contact hole, and the conductive film is etched into a desired shape to form a wiring 837 of a source electrode, a drain electrode or the like (FIG. 9D). By forming the wiring, the semiconductor layer 814 becomes a resistor, and the capacitor 815 becomes a stacked type capacitor. A first capacitor is formed by the semiconductor layer 816, the conductive layers 818 and 819 and the insulating film 817 sandwiched by the semiconductor layer 816 and the conductive layers 818 and 819, and a second capacitor is formed by the conductive layers 818 and 819, the metal film 834 and the insulating film 820 sandwiched by the conductive layers 818 and 819 and the metal film 834.

By forming a silicide in a desired region of the semiconductor layer, resistance of the source and drain regions can be decreased and resistance of a contact can be reduced, in the case where the plurality of TFTs having different structures, the resistor and the capacitor are mounted together on the same glass substrate, as in this embodiment.

Embodiment 3

Embodiment 3 describes an example of forming a CPU or a memory over a glass substrate or a plastic substrate by using a thin film integrated circuit that is obtained in Embodiment Modes 1 to 3 and Embodiments 1 and 2.

Figure 10:
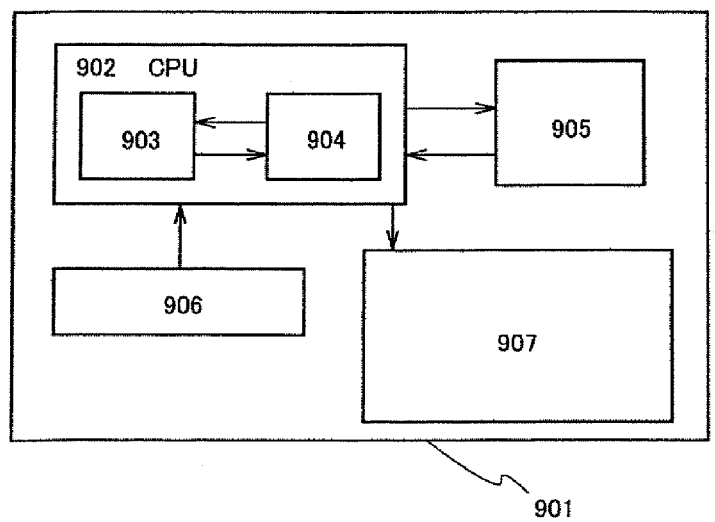
FIG. 10 shows Embodiment 4.

In FIG. 10, a central processing unit (also referred to as a CPU) 902, an arithmetic unit 903, a control unit 904, a memory unit 905 (also referred to as a memory), an input portion 906, and an output portion (such as a display portion) 907 are formed over a substrate 901. This embodiment describes an example in which a CPU, a memory unit and a display portion are formed over the same substrate; however, is not limited to this structure.

The central processing unit 902 includes the arithmetic unit 903 and the control unit 904. The arithmetic unit 903 includes an arithmetic logic unit (ALU) for carrying out an arithmetic operation such as addition and subtraction, and a logic operation such as AND, OR, NOT; various registers for temporarily storing the data and the results of operation; a counter for counting the number of "1" which is inputted; and the like. A circuit constituting a part of the arithmetic unit 903, for example, an AND circuit, an OR circuit, a NOT circuit, a buffer circuit, a register circuit or the like can be made up of thin film integrated circuits according to the present invention.

The control unit 904 includes a program counter, a command register, and a control signal generating unit. The control unit 904 executes command stored in the memory unit 905 to control all operations. A thin film integrated circuit of the present invention can be used for a circuit constituting the control unit 904.

The memory unit 905 stores data and command for arithmetic operation and stores data and programs to be executed in the central processing unit 902. The memory unit 905 includes a main memory, an address register, and a data register. A cash memory can be used in addition to the main memory. Such memories may be formed by using an SRAM, a DRAM, a flash memory, or the like, and can be formed from a thin film integrated circuit of the present invention.

The input portion 906 loads data or programs from outside. The output portion 907 is a device for displaying results, typically, a display device, and can be formed from a thin film integrated circuit of the present invention.

Embodiment 4

Embodiment 4 describes an example of forming an electronic card incorporating a thin film integrated circuit such as a microprocessor (such as CPU) or a memory using a thin film integrated circuit, which is obtained in Embodiment Modes 1 to 3 and Embodiments 1 and 2, over a glass substrate and a plastic substrate. It is to be noted that electronic cards include an ID card to serve as an identification paper, a semi hard card having flexibility such as a plastic card, and the like.

Figure 11:
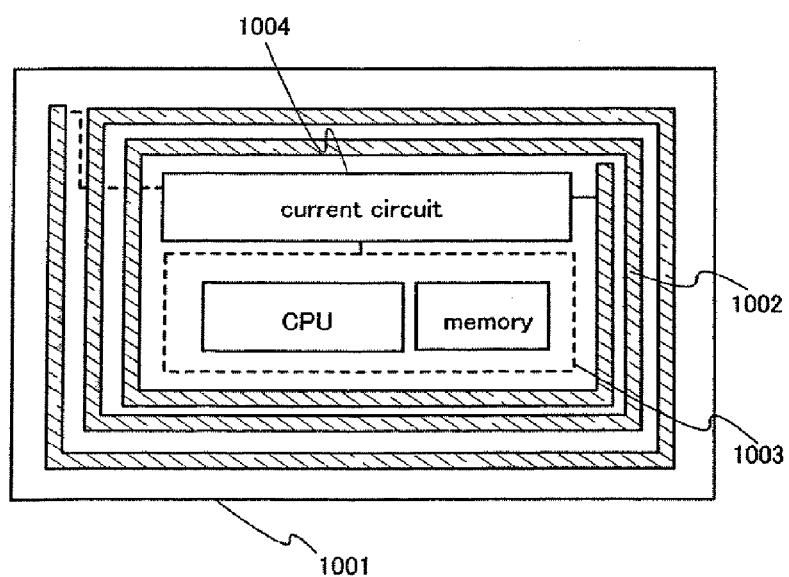
FIG. 11 shows Embodiment 5.

A top view of an electronic card is shown in FIG. 11. In the electronic card 1001, an antenna 1002 provided in the periphery of the card, a thin film integrated circuit 1003 to be connected to the antenna, and a current circuit 1004 are mounted.

The application of electronic cards is wide-ranging and the cards are applied to ATM cards, credit cards, prepaid cards, patient's registration cards, identity cards such as a student card or employee ID cards, season tickets, membership cards, and the like.

Embodiment 5

Electronic devices that are each manufactured using a semiconductor device having a thin film integrated circuit of the present invention are as follows: a video camera, a digital camera, a goggle type display (head mounted display), a navigation system, an audio player (such as a car audio compo or an audio compo), a computer, a game machine, a personal digital assistant (such as a mobile computer, a cellular telephone, a portable game machine or an electronic book), an image reproducing device provided with a recording medium (typically, a DVD player) and the like. Practical examples thereof are shown in FIGS. 12A to 12H.

Figure 12A:
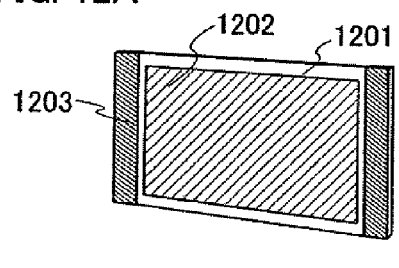
FIGS. 12A to 12H each shows an example of electronic devices to which a thin film integrated circuit according to the present invention is applied.

FIG. 12A shows a display device which includes a casing 1201, a display portion 1202, a speaker portion 1203 and the like. A thin film integrated circuit according to the present invention can be applied to the display portion 1202. In addition, although not shown, the thin film integrated circuit can be applied to functional circuits such as an MPU, a memory, and an I/O interface. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter display device can be realized. Note that display devices include all types of display devices to show information for a personal computer, a TV broadcasting reception, an advertisement and the like.

Figure 12B:
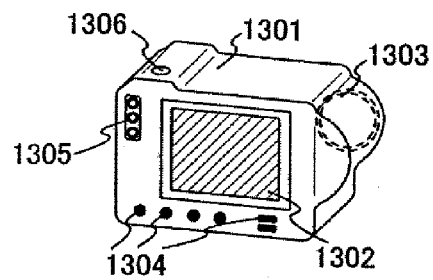

FIG. 12B shows a digital camera which includes a main body 1301, a display portion 1302, an image receiving portion 1303, an operation key 1304, an external connection port 1305, a shutter 1306 and the like. A thin film integrated circuit according to the present invention can be applied to the display portion 1302. In addition, although not shown, the thin film integrated circuit can be applied to functional circuits such as an MPU, a memory, and an I/O interface. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter digital camera can be realized.

Figure 12C:
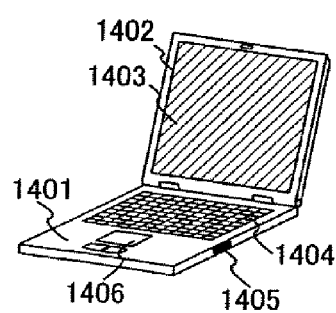

FIG. 12C shows a computer which includes a main body 1401, a casing 1402, a display portion 1403, a keyboard 1404, an external connection port 1405, a pointing mouse 1406 and the like. A thin film integrated circuit according to the present invention can be applied to the display portion 1403. In addition, although not shown, the thin film integrated circuit can be applied to functional circuits such as an MPU, a memory, and an I/O interface. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter computer can be realized.

Figure 12D:
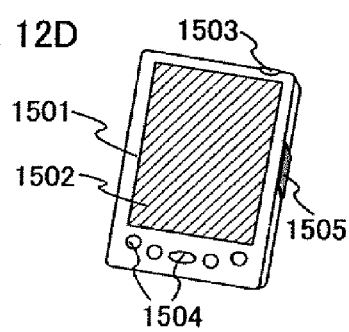

FIG. 12D shows a mobile computer which includes a main body 1501, a display portion 1502, a switch 1503, an operation key 1504, an infrared port 1505 and the like. A thin film integrated circuit according to the present invention can be applied to the display portion 1502. In addition, although not shown, the thin film integrated circuit can be applied to functional circuits such as an MPU, a memory, and an I/O interface that are provided inside the casing. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter mobile computer can be realized.

Figure 12E:
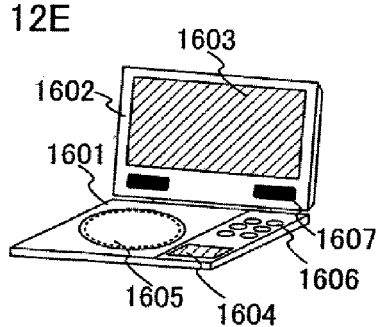

FIG. 12E shows a portable type image reproducing device provided with a recording medium (typically, a DVD player) which includes a main body 1601, a casing 1602, a display portion A1603 and a display portion B1604, a recording medium (such as DVD) loading portion 1605, an operation key 1606, a speaker portion 1607 and the like. The display portion A1603 mainly displays image information, and the display portion B1604 mainly displays character information. A thin film integrated circuit according to the present invention can be applied to the display portion A 1603 and the display portion B 1604. In addition, although not shown, the thin film integrated circuit can be applied to functional circuits such as an MPU, a memory, and an I/O interface that are provided inside the casing. Note that such image reproducing devices provided with a recording medium include a home-use game machine and the like. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter image reproducing device can be realized.

Figure 12F:
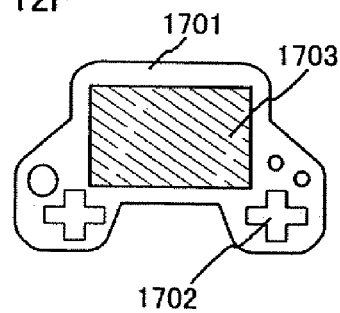

FIG. 12F shows a game machine which includes a main body 1701, a display portion 1703, an operation switch 1702 and the like. A thin film integrated circuit according to the present invention can be applied to the display portion 1703. In addition, although not shown, the thin film integrated circuit according to the present invention can be applied to functional circuits such as an MPU, a memory, and an I/O interface that are provided inside the casing. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter game machine can be realized.

Figure 12G:
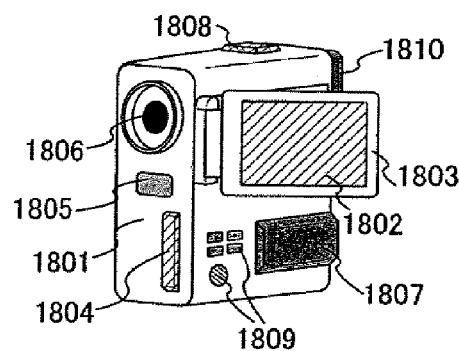

FIG. 12G shows a video camera which includes a main body 1801, a display portion 1802, a casing 1803, an external connection port 1804, a remote controller receiving portion 1805, an image receiving portion 1806, a battery 1807, an audio input portion 1808, an operation key 1809, an eye piece portion 1810 and the like. A thin film integrated circuit according to the present invention can be applied to the display portion 1802. In addition, although not shown, the thin film integrated circuit can be applied to functional circuits such as an MPU, a memory, and an I/O interface that are provided inside the casing. A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter video camera can be realized.

Figure 12H:
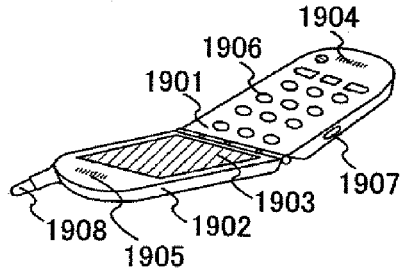

FIG. 12H shows a cellular telephone which includes a main body 1901, a casing 1902, a display portion 1903, an audio input portion 1904, an audio output portion 1905, an operation key 1906, an external connection port 1907, an antenna 1908 and the like A thin film integrated circuit according to the present invention can be applied to the display portion 1903. In addition, although not shown, the thin film integrated circuit can be applied to functional circuits such as an MPU, a memory, and an I/O interface that are provided inside the casing A display device which can operate at high speed and is high-definition and high-reliable can be realized by using a thin film integrated circuit manufactured according to the present invention. Moreover, by using a thin film integrated circuit over a flexible substrate, a miniaturized, thinner and lighter cellular telephone can be realized.

As described above, a thin film integrated circuit that is formed by using any structure of Embodiment Modes 1 to 5 and Embodiments 1 to 4 can be applied to a display portion of various electronic devices and to functional circuits such as an MPU, a memory, and an I/O interface.

What is claimed is:

1. A thin film integrated circuit comprising:
    a glass substrate;
    a first metal film over the glass substrate;
    a first insulating film over the first metal film;
    a capacitor comprising a second metal film, a conductive layer and a second insulating film interposed between the second metal film and the conductive layer, and
    a thin film transistor over the first insulating film,
    wherein a gate electrode of the thin film transistor is made of a same layer as the conductive layer,
    wherein the second metal film contains one or more metal elements,
    wherein a silicide is included in at least one of a source region and a drain region of the thin film transistor,
    wherein the silicide comprises all metal elements of the second metal film, and
    wherein the first metal film is one element selected from the group consisting of Ti, Al, Ta, W, Mo, Cu, Cr, Nd, Fe, Ni, Co, Zr, Zn, Ru, Rh, Pd, Os, Ir, and Pt, or an alloy material or a compound material mainly containing the element.

2. The thin film integrated circuit according to claim 1, wherein the first metal film prevents for the glass substrate to contact with the first insulating film.

3. The thin film integrated circuit according to claim 1, wherein a sidewall is formed on a side face of the gate electrode of the thin film transistor.

4. The thin film integrated circuit according to claim 1, wherein the thin film integrated circuit is incorporated into a CPU.

5. The thin film integrated circuit according to claim 1, wherein the thin film integrated circuit is incorporated into an electronic card.

6. The thin film integrated circuit according to claim 1, wherein the thin film integrated circuit is incorporated into an electronic device selected from the group consisting of a display device, a digital camera, a computer a mobile computer, a portable type image reproducing device, a game machine, a video camera, and a cellular telephone.

* * * * *